United States Patent [19]

Minakuchi

[11] 4,296,380
[45] Oct. 20, 1981

[54] PROGRAMMABLE DIGITAL FREQUENCY DIVIDER FOR SYNTHESIZING SIGNALS AT DESIRED FREQUENCY

[75] Inventor: Hiroshi Minakuchi, Kadoma, Japan

[73] Assignee: Matsushita Electric Industrial Co., Osaka, Japan

[21] Appl. No.: 40,618

[22] Filed: May 21, 1979

[51] Int. Cl.³ .................. H03K 21/34; H03L 7/18
[52] U.S. Cl. ............................. 328/48; 328/61; 235/92 PE
[58] Field of Search ............... 328/48, 49, 61, 63; 235/92 PE

[56] References Cited

U.S. PATENT DOCUMENTS

| 3,657,658 | 4/1972 | Kubo | 328/61 |
| 3,824,379 | 7/1974 | Tomisawa et al. | 235/92 PE |
| 3,863,224 | 1/1975 | Alexander | 235/92 PE |
| 4,225,824 | 9/1980 | Sekine et al. | 328/48 |

Primary Examiner—John S. Heyman

Attorney, Agent, or Firm—Pollock, VandeSande & Priddy

[57] ABSTRACT

A programmable digital frequency divider comprises a programmable binary counter in receipt of an input pulse train to develop output pulses at a frequency variable as a function of a set of binary program control signals supplied in the form of normal binary number system. A binary code converter is provided to convert the binary number system of the program control signal into a modified binary number system in which the modified binary number is an integral multiple of the corresponding input binary number minus error compensating binary digits, wherein the number of compensating bits differs depending on the particular binary number. Electrical signals representing the modified binary numbers are supplied to the program input terminals of the binary counter so that the frequency of its output signal is substantially linearly variable as a function of discrete variations of the program control signal.

22 Claims, 8 Drawing Figures

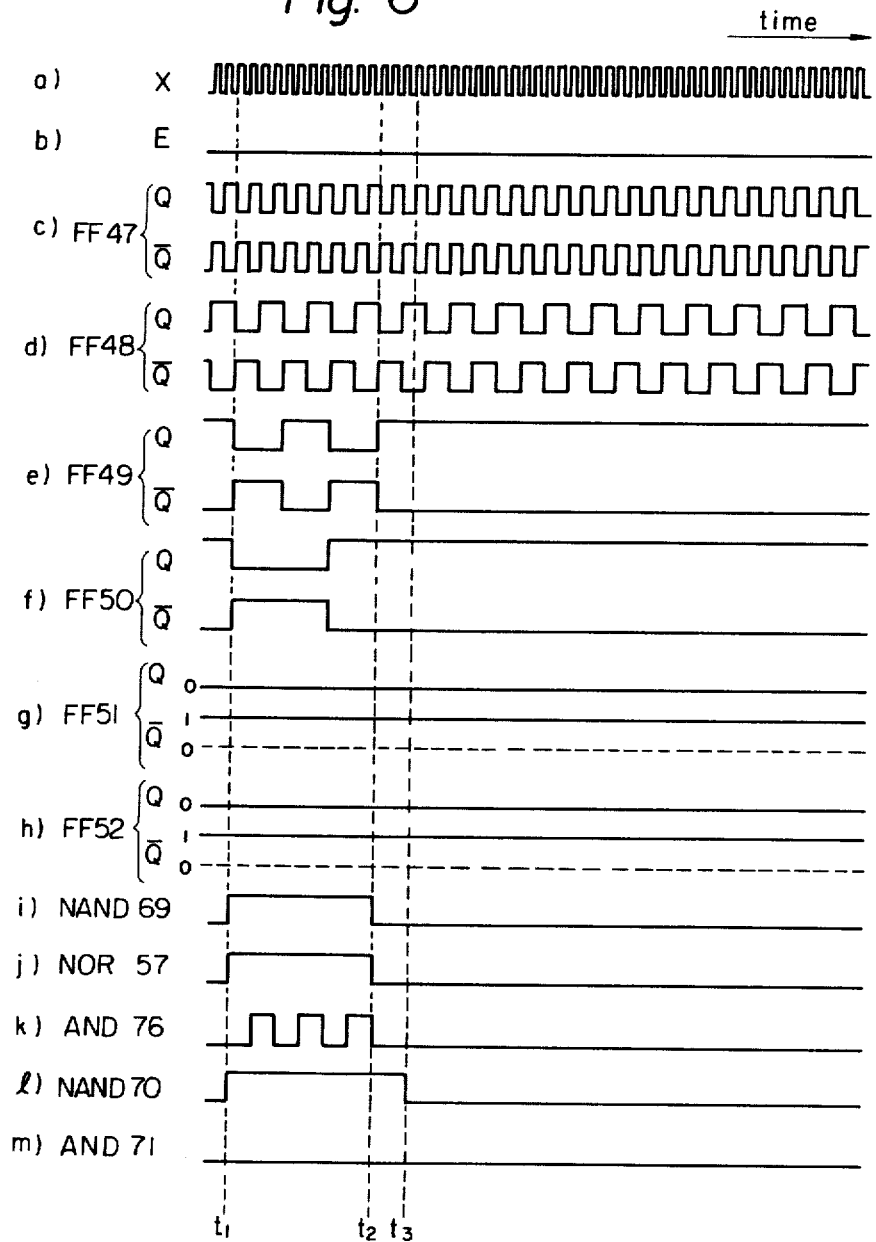

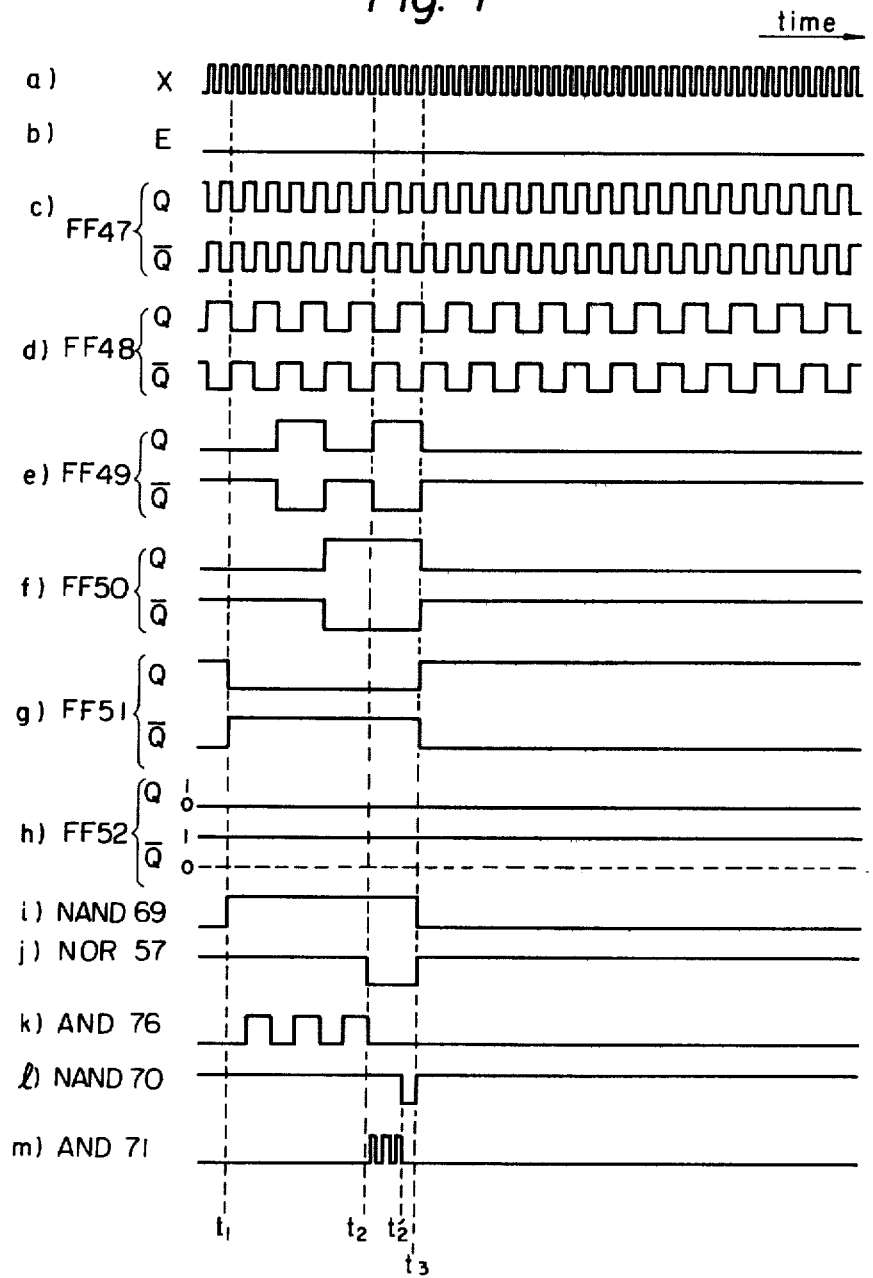

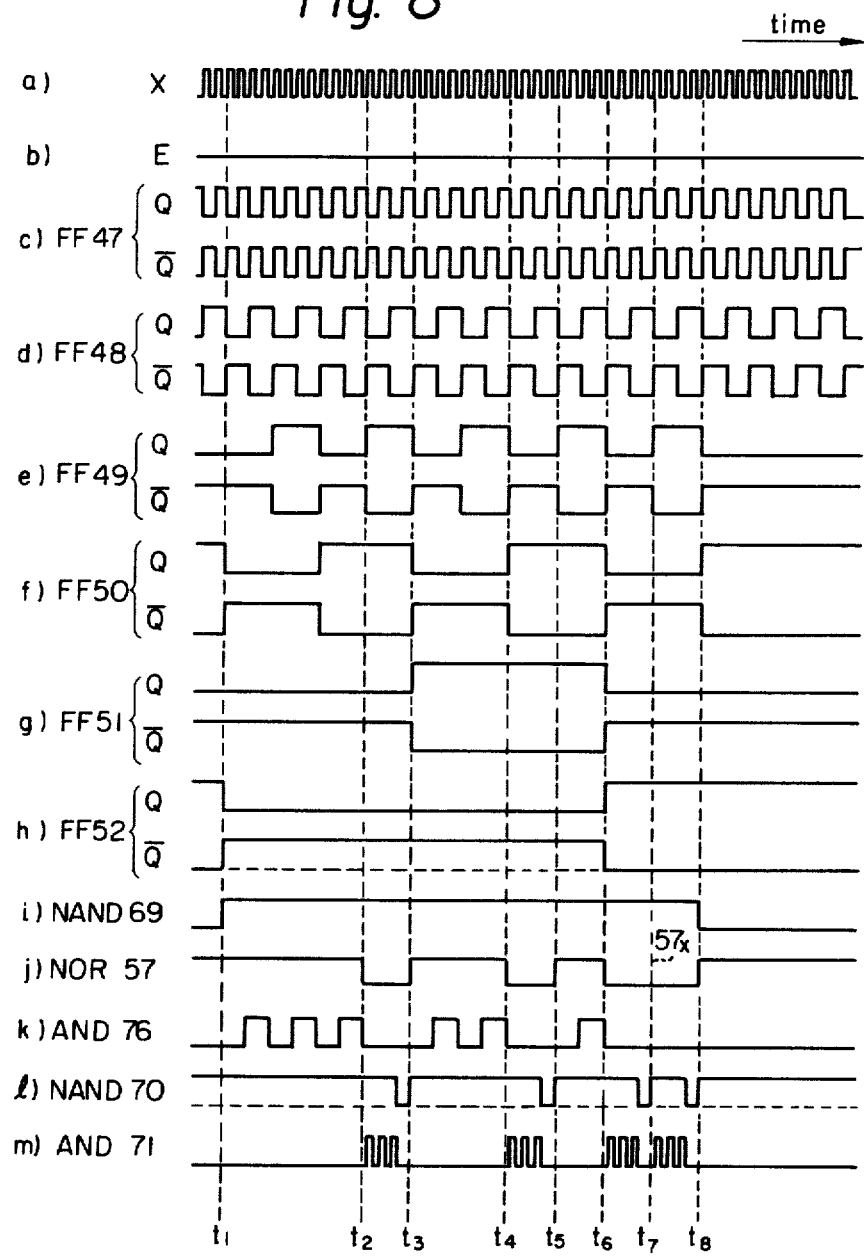

4,296,380

PROGRAMMABLE DIGITAL FREQUENCY DIVIDER FOR SYNTHESIZING SIGNALS AT DESIRED FREQUENCY

BACKGROUND OF THE INVENTION

The present invention relates generally to programmable frequency dividers, and in particular to a programmable digital frequency divider and synthesizer which delivers signals at a frequency which is variable substantially linearly as a function of a set of input binary states.

With conventional programmable frequency synthesizers, which serve as a standard frequency source for motor speed control purposes, the output frequency is nonlinearly variable as a function of discrete variations of frequency control input signals. More specifically, the prior frequency synthesizer employs a programmable frequency divider whose output frequency is nonlinearly variable as a function of stepwise variations of the program control input signal. Therefore, as the ratio of frequency division is varied in response to the control signal the output frequency tends to deviate from the correct frequency and the amount of this deviation increases with increase in the output frequency.

SUMMARY OF THE INVENTION

It is an object of the present invention to provide a programmable digital frequency divider which delivers output pulses at frequencies variable substantially linearly as a function of discrete variations of program control signal.

According to one feature of the invention, the digital frequency divider comprises a programmable counter and a binary code converter which converts the normal binary number system into a modified binary number system in which the modified binary number is an integral multiple of the corresponding input binary number with one or more error correcting binary digits eliminated from the multiplied binary numbers. A set of binary signals representing the modified binary number system is applied to the programmable counter to alter its frequency division ratio, so that the counter delivers signals at a frequency which is substantially linearly related to each set of binary program input signals representing the normal binary number system.

The digital programmable frequency divider of the invention is advantageously employed in combination with a source of clock pulses to synthesize a variable frequency signal.

BRIEF DESCRIPTION OF THE DRAWINGS

The invention will be further described by way of example with reference to the accompanying drawings, in which:

FIGS. 6–8 are timing diagrams useful for describing the operation of the FIG. 5 embodiment.

DETAILED DESCRIPTION

Figure 1:
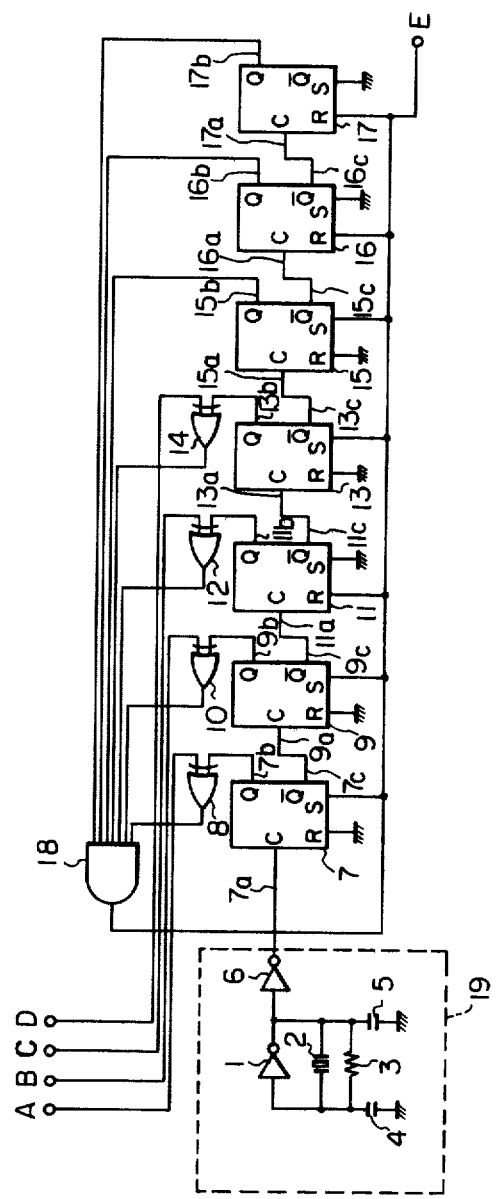
FIG. 1 is a block diagram of a prior art frequency synthesizer.

Before describing the present invention reference is first made to FIG. 1 in which a prior art frequency demultiplier or divider is illustrated. In FIG. 1, reference numeral 1 is an inverter, which together with a crystal quartz oscillator element 2, resistance 3 and capacitors 4 and 5 constitutes an oscillator. An inverter 6 is provided which serves as a buffer amplifier whose output is connected to the clock input terminal 7a of a flip-flop 7. To the output terminal 7b of the flip-flop 7 is connected an input terminal of an Exclusive-OR gate 8, and to the complementary output terminal 7c of the flip-flop 7 is connected the clock input terminal 9a of a flip-flop 9. To the true output terminal 9b of the flip-flop 9 is connected an input terminal of an Exclusive-OR gate 10 and to the complementary output 9c of the flip-flop 9 is connected the clock input terminal 11a of a flip-flop 11. To the true output terminal 11b of the flip-flop 11 is connected an input terminal of an Exclusive-OR gate 12 and to the complementary output terminal 11c of the flip-flop 11 is connected the clock input terminal 13a of a flip-flop 13. To the true output terminal 13b of the flip-flop 13 is connected an input terminal of an Exclusive-OR gate 14 and to the complementary output 13c of the flip-flop 13 is connected the clock input terminal 15a of a flip-flop 15. To the complementary output 15c of the flip-flop 15 is connected the clock input terminal 16a of a flip-flop 16 whose complementary output 16c is connected to the clock input terminal 17a of a flip-flop 17.

Furthermore, another input terminal of each of the Exclusive-OR gates 8, 10, 12 and 14 is connected to program input terminals A, B, C and D, respectively. The output terminals of these Exclusive-Or gates and the true output terminals 15b, 16b and 17b of flip-flops 15, 16 and 17 are connected to respective input terminals of an AND gate 18 whose output terminal is connected to the set input terminals of flip-flops 7, 9, 13 and 15 and also to the reset input terminals of flip-flops 11, 16 and 17, and further to an output terminal E of the frequency divider.

Each of the flip-flops 7, 9, 11, 13, 15, 16 and 17 is designed to switch to a logic "1", which appears as a high voltage level at the true output terminal, in response to the leading or positive edge of an input clock pulse when the set and reset input terminals are both at a logic "0" or low voltage level, and also switch to logic "1" when each flip-flop receives a logic "1" signal at its set input terminal regardless of the binary state of its clock input terminal, and switch to a logic "0" level whenever a logic "0" signal is applied to the reset input regardless of the binary state of the clock input terminal.

Assuming that a set of binary signals "0000" is applied to the program input terminals D, C, B and A, each flip-flop generates a logic "1" output, so that the output of the AND gate 18 is switched to logic "1", causing flip-flops 17, 16, 15, 13, 11, 9 and 7 to reset to logic levels "0011011", respectively. In other words, the output terminal E is preset to a binary digits "0011011" which is a decimal value of "27" when all the flip-flops are at logic level "1111111" which is a decimal value of "127", whereby the frequency divider changes its binary state in 100 discrete steps starting from the decimal value of 27 to the decimal value of 127. Therefore the output frequency of the divider is 1/100 of the input frequency.

Assuming next that the program input is changed to "0001", the flip-flops will be reset to "0011011" as counted from flip-flop 17 down to flip-flop 7 when these flip-flops are at logic levels "1111110", respectively. In this case, the frequency divider is preset to a division ratio of 1/99. In the same manner, a program signal of "1111" will produce a set of logic levels "1110000" which cause the flip-flops to change to "0011011", presetting the frequency divider to a ratio of 1/85. As seen from Table I, as the program input is varied with a step of binary "1" from decimal "0" to decimal "10", for example, with corresponding frequency division ratios from 1/100 to 1/90 and the input frequency is set at 100 kHz, the output frequency varies from 1000 Hz to 1111 Hz with a variation ranging from +0.000 to +11.111%. However, it is noted that the output frequency does not vary at equal steps and the amount of error increases with deviation from 1000 Hz, as best indicated by dotted lines in FIG. 4.

TABLE I

| Program Input | | Output | | |
|---|---|---|---|---|
| Decimal | Binary "DCBA" | Division Ratio | Frequency (Hz) | Variation (%) |
| 0 | 0000 | 1/100 | 1000 | +0.000 |
| 1 | 0001 | 1/99 | 1010 | +1.010 |
| 2 | 0010 | 1/98 | 1020 | +2.041 |
| 3 | 0011 | 1/97 | 1031 | +3.093 |
| 4 | 0100 | 1/96 | 1042 | +4.167 |
| 5 | 0101 | 1/95 | 1053 | +5.263 |
| 6 | 0110 | 1/94 | 1064 | +6.383 |
| 7 | 0111 | 1/93 | 1075 | +7.527 |
| 8 | 1000 | 1/92 | 1087 | +8.696 |
| 9 | 1001 | 1/91 | 1099 | +9.890 |
| 10 | 1010 | 1/90 | 1111 | +11.111 |

This unequal frequency change is particularly disadvantageous in applications such as CB transceivers or frequency synthesizers.

Phase-locked loop frequency synthesizers may serve as a solution to this problem. However, it requires the use of analog circuit elements such as voltage controlled oscillator and lowpass filter and if the system is constructed on an integrated circuit chip, capacitors must be mounted outside of the chip, which tends to produce interference between a crystal oscillator and the voltage-controlled oscillator.

Figure 2:
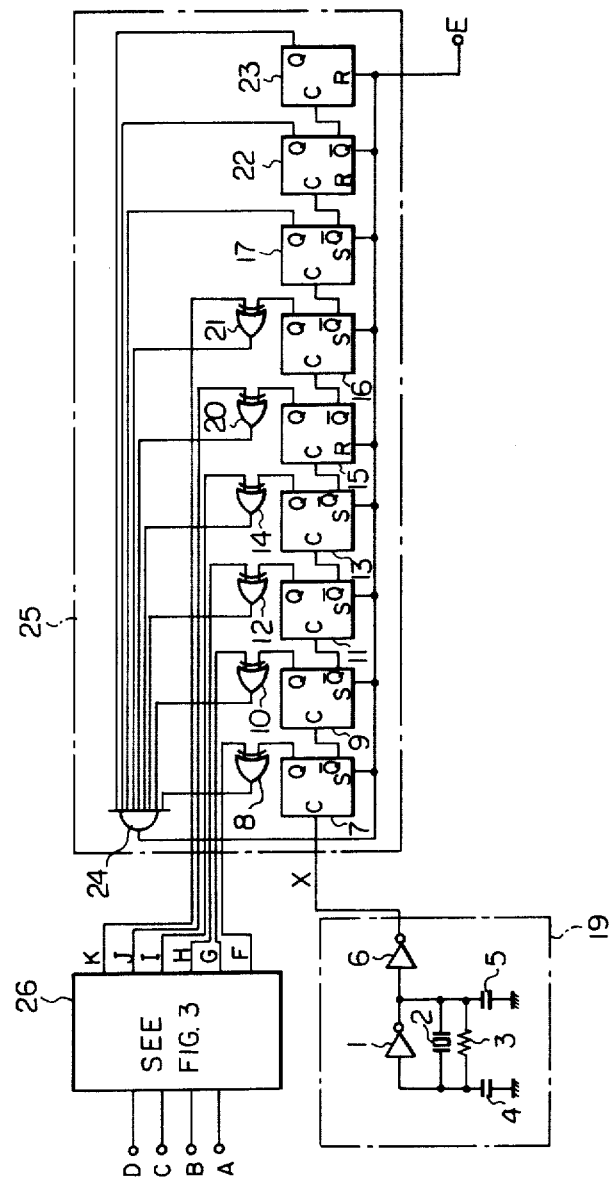
FIG. 2 is a general block diagram of the frequency synthesizer embodying the digital programmable frequency divider of the invention.

FIG. 2 is an illustration of an embodiment of the present invention wherein the same parts are indicated by the same reference as used in FIG. 1.

In FIG. 2 the output signal or train of clock pulses from the standard frequency signal source 19 is applied to an X input terminal of a programmable frequency divider or programmable binary counter 25 which comprises flip-flops 7, 9, 11, 13, 15, 17, 22, 23, Exclusive-OR gates 8, 10, 12, 14, 20, 21, and an AND gate 24 which takes its inputs from the outputs of the Exclusive-OR gates 8, 10, 12, 14, 20 and 21 and from the outputs of flip-flops 17, 22 and 23. To the output terminal of the AND gate 24 are connected the set input terminals of flip-flops 7, 9, 11, 13, 16 and 17 and the reset input terminals of flip-flops 15, 22 and 23. With this circuit arrangement, the programmable divider 25 is preset to a binary state "001101111" corresponding to a decimal "111" when the output of AND gate 24 goes high.

A binary code converter 26 is provided which takes its binary inputs from program input terminals A, B, C and D and delivers its binary outputs through terminals F, G, H, I, J and K to one input of Exclusive-OR gates 8, 10, 12, 14, 20 and 21, respectively.

Figure 3:
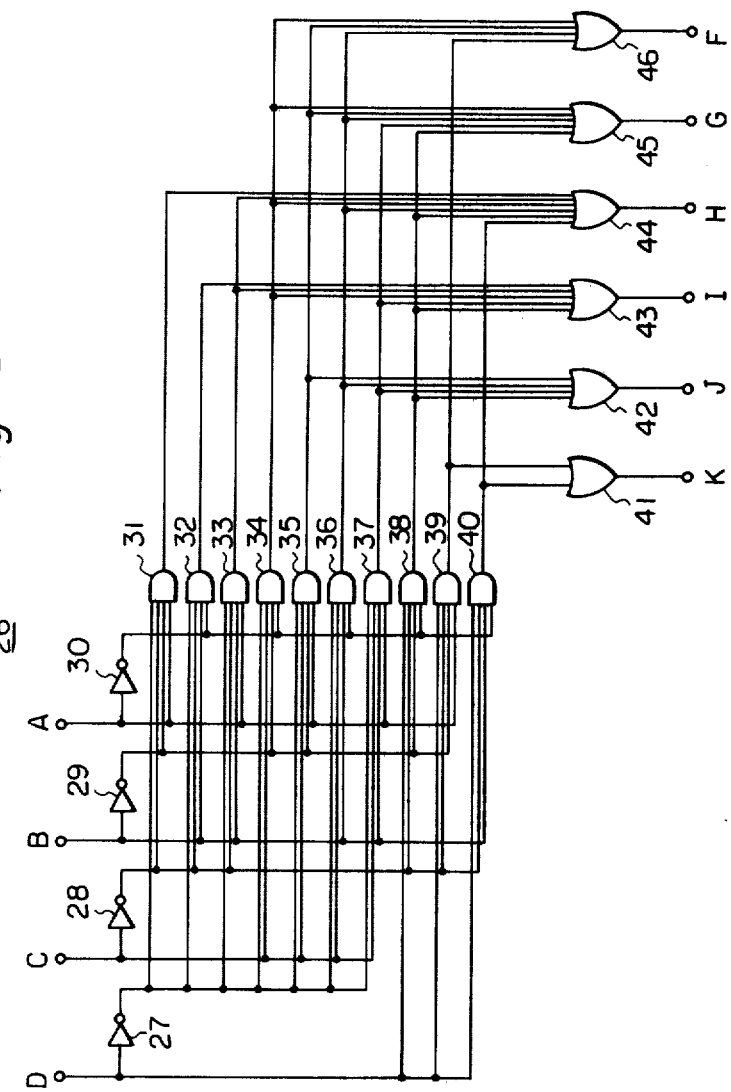
FIG. 3 shows details of a binary code converter of FIG. 2.

FIG. 3 illustrates an example of the binary code converter 26 which comprises inverter circuits 27 to 30, AND gates 31 to 40 and OR gates 41 to 46. The inverter 27 takes its input from program input terminal D and delivers its inverted output to AND gates 31 to 37. The inverter 28 takes its input from terminal C and delivers its inverted output to AND gates 31-33 and 38-40, the inverter 29 taking its input from terminal B and delivering its inverted output to AND gates 31, 34, 35, 38 and 39, and inverter 30 taking its input from terminal A and delivering its inverted output to AND gates 32, 34, 36, 38 and 40. On the other hand, terminal D is connected directly to AND gates 38 to 40, terminal C being directly connected to AND gates 34 to 37; terminal B being directly connected to AND gates 32, 33, 36, 37 and 40; and terminal A being directly connected to AND gates 31, 33, 35, 37 and 39. OR gate 41 takes its inputs from the outputs of AND gates 39 and 40 and delivers its output to terminal K; OR gate 42 taking its inputs from the output of AND gates 35 to 38 and delivering its output to terminal J; Or gate 43 taking its inputs from the outputs of AND gates 32, 33, 34, 37 and 38 and delivering its output to terminal I; OR gate 44 taking its inputs from the outputs of AND gates 31, 33, 34, 36, 38 and 40 and delivering its output to terminal H; OR gate 45 taking its inputs from the outputs of AND gates 34 to 38 and delivering its output to terminal G; and OR gate 46 taking its inputs from the outputs of AND gates 34, 35, 36 and 39 and delivering its output to terminal F.

With this circuit arrangement, the following relations hold between input and output binary states:

| INPUT BINARY STATES | | | | OUTPUT BINARY STATES | | | | | |
|---|---|---|---|---|---|---|---|---|---|
| D | C | B | A | K | J | I | H | G | F |
| [0 | 0 | 0 | 0] | [0 | 0 | 0 | 0 | 0 | 0] |
| [0 | 0 | 0 | 1] | [0 | 0 | 0 | 1 | 0 | 0] |
| [0 | 0 | 1 | 0] | [0 | 0 | 1 | 0 | 0 | 0] |
| [0 | 0 | 1 | 1] | [0 | 0 | 1 | 1 | 0 | 0] |
| [0 | 1 | 0 | 0] | [0 | 0 | 1 | 1 | 1 | 1] |
| [0 | 1 | 0 | 1] | [0 | 1 | 0 | 0 | 1 | 1] |
| [0 | 1 | 1 | 0] | [0 | 1 | 0 | 1 | 1 | 1] |
| [0 | 1 | 1 | 1] | [0 | 1 | 1 | 0 | 1 | 0] |
| [1 | 0 | 0 | 0] | [0 | 1 | 1 | 1 | 1 | 0] |
| [1 | 0 | 0 | 1] | [1 | 0 | 0 | 0 | 0 | 1] |
| [1 | 0 | 1 | 0] | [1 | 0 | 0 | 1 | 0 | 0] |

When the output binary state is "000000", all the flip-flops are switched to "1" state which corresponds to a decimal number "511" and AND gate 24 is thus switched to a high output state to cause flip-flops 23, 22, 17, 16, 15, 13, 11, 9 and 7 to produce a set of binary signals "001101111" which corresponds to a decimal number "111". It is to be noted that in response to the output decimal number 511 the programmable frequency divider 25 is preset to a decimal number 111, so that the repetition frequency of the signal appearing at the output terminal E is 1/400 times the frequency of the input signal applied to the terminal X. Likewise, in response to a set of binary states "000100" at the terminals K, J. I, H, G and F, respectively, the frequency division ratio becomes 1/396, as listed in Table II, in which the frequency of the signal at terminal X is 400 kHz.

TABLE II

| Program Input | | Corrected | Output | | |
|---|---|---|---|---|---|
| Decimal | Binary "DCBA" | Binary KJIHGF | Division Ratio | Frequency (Hz) | Variation (%) |
| 0 | 0000 | 000000 | 1/400 | 1000.0 | +0.000 |
| 1 | 0001 | 000100 | 1/396 | 1010.1 | +1.010 |
| 2 | 0010 | 001000 | 1/392 | 1020.4 | +2.041 |
| 3 | 0011 | 001100 | 1/388 | 1030.9 | +3.093 |
| 4 | 0100 | 001111 | 1/385 | 1039.0 | ˙3.896 |
| 5 | 0101 | 010011 | 1/381 | 1049.9 | +4.987 |
| 6 | 0110 | 010111 | 1/377 | 1061.0 | +6.101 |
| 7 | 0111 | 011010 | 1/374 | 1069.5 | +6.952 |
| 8 | 1000 | 011110 | 1/370 | 1081.1 | +8.108 |
| 9 | 1001 | 100001 | 1/367 | 1089.9 | +8.992 |
| 10 | 1010 | 100100 | 1/364 | 1098.9 | +9.890 |

Figure 4:
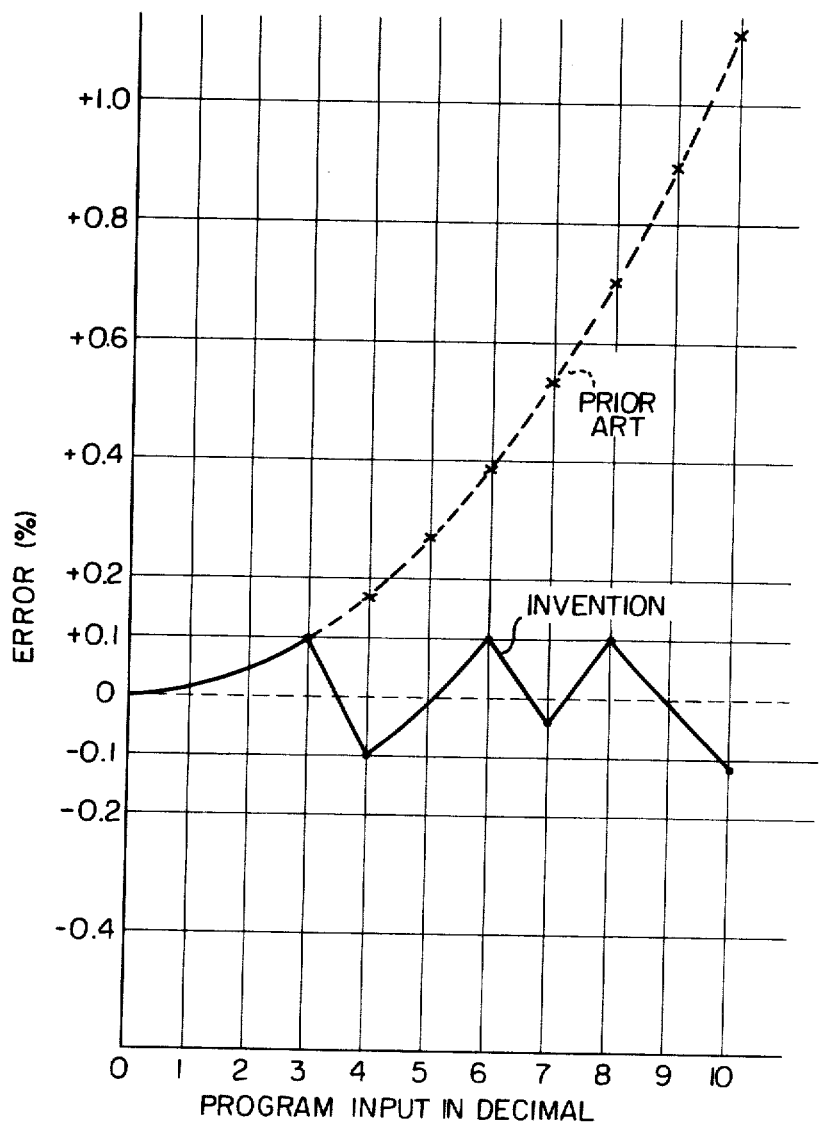
FIG. 4 is a graphic illustration of the frequency variation error rate of the invention as a function program input represented by decimal number in comparison with the prior art system.

As seen from Table II the output frequency changes with substantially equal steps. This is best shown in FIG. 4 in which the solid line curve indicates the frequency deviation error of the embodiment of FIG. 2 which substantially lies within a range of ±1 percent. The frequency variation error may be more reduced by increasing the number of flip-flop stages as necessary.

Figure 5:
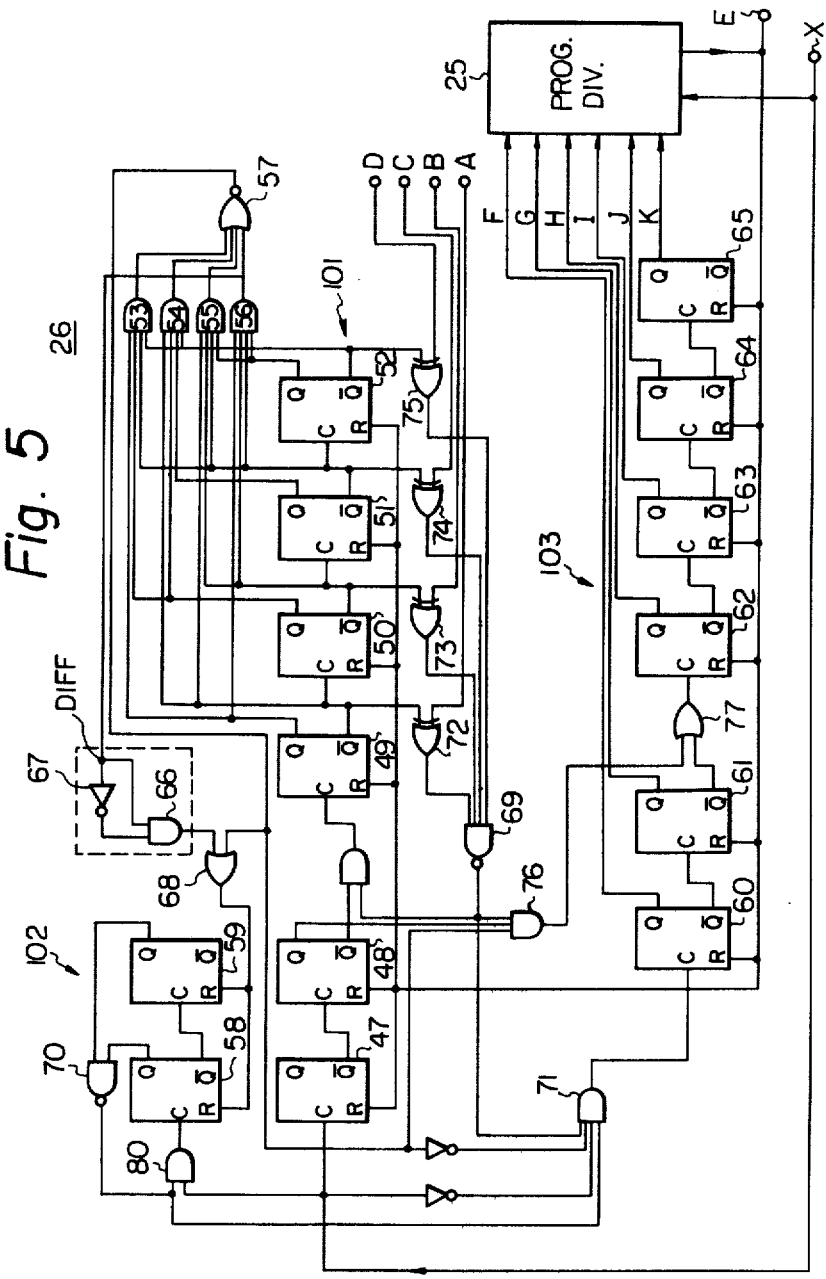
FIG. 5 shows details of another binary code converter of FIG. 2.

A second embodiment of the invention is illustrated in FIG. 5 in which flip-flops 47 to 52 constitute a first binary counter 101, flip-flops 60 to 65 constitute a second binary counter 102, and flip-flops 58 and 59 constitute a third binary counter 103. The flip-flops of the first and second counters 101, 102 have their reset terminals connected together to the output terminal E, and the flip-flops 58, 59 of the third binary counter 103 have their reset terminals connected together to the output of an OR gate 68.

The operation of the embodiment of FIG. 5 is first visualized with reference to FIGS. 6a to 6m. Assuming that binary digits "0 0 1 1" are applied to control input terminals D, C, B and A, respectively, and a logic "1" is delivered from the programmable counter 25 at time $t_1$ (FIG. 6b), resetting all the flip-flops of first and second counters 101 and 102 (FIGS. 6c to 6h). This feeds a logic "1" to all Exclusive-OR gates 72 to 75 to result in a logic "1" output from NAND gate 69 (FIG. 6i). Since the Q outputs of flip-flops 49 to 52 are all at logic "0" level and AND gates 53 to 56 thus provide logic "0" outputs to a NOR gate 57, the latter delivers a logic "1" output (FIG. 6j) to the reset terminals of flip-flops 58 and 59 of the third counter 103 via OR gate 68, thereby delivering logic "0"s to a NAND gate 70 causing it to apply a logic "1" (FIG. 6l) to an AND gate 71 through line 70a, while at the same time enabling an AND gate 80. A train of clock pulses is applied to input terminal X as illustrated in FIG. 6a. The first counter 101 is thus conditioned to receive the clock pulse train to change the binary states of its flip-flops 47 to 59 as illustrated in FIGS. 6c to 6f. As a result, flip-flops 52, 51, 50 and 49 produce binary digits "1 1 0 0", respectively, at their complementary output terminals at time $t_2$, whereby Exclusive-OR gates 72 to 75 deliver logic "1" outputs to NAND gate 69 whose output is thus switched to logic "0" level (FIG. 6i). Simultaneously, AND gate 53 is activated to deliver a logic "1" to the NOR gate 57 to switch its output to logic "0" state (FIG. 6j), whereupon flip-flops 58 and 59 are enabled to start counting clock pulses supplied through AND gate 80. Upon receipt of three clock pulses, the third counter 103 delivers a logic "1" to NAND gate 70 to switch it to logic "0" output state at time $t_3$ (FIG. 6l).

During time interval between $t_1$ to $t_2$, AND gate 76 is enabled by the logic "1" pulses from the NAND gate 69 and NOR gate 57 to pass three pulses from the Q output of flip-flop 48 to the clock input of flip-flop 62 via OR gate 77 (FIG. 6k). Since AND gate 71 is held at logic "0" output state (FIG. 6m), the binary digits of the terminals K, J, I, H, G and F are "0 0 1 1 0 0", respectively, resetting the frequency division ratio to 1/388.

Consider now that binary digits "0 1 0 0" are applied to control input terminals D, C, B and A, respectively. Referring to FIGS. 7a to 7m, the flip-flops 47 to 51 change their binary states as illustrated in FIGS. 7c to 7g, respectively. When the binary states of the complementary outputs of flip-flops 52, 51, 50 and 49 become "1 0 1 1", respectively, at time $t_3$, NAND gate 69 changes its output state from logic "1" to "0" (FIG. 7i). On the other hand, the true outputs of flip-flops 52, 51, 50 and 49 become "0 0 1 1" at time $t_2$ to cause AND gate 53 to change its output state from logic "0" to "1" to thereby cause NOR gate 57 to change its output state to logic "0" (FIG. 7j) and returns to logic "1" when the true outputs of flip-flops 52, 51, 50 and 49 assume binary states "0 1 0 0" at time $t_3$.

When the NOR gate 57 changes the logic "0" level at time $t_2$, the third counter 103 initiates counting clock pulses and as it has counted three clock pulses NAND gate 70 is activated in response to logic "1" pulses from the true complementary outputs of flip-flops 58 and 59 and changes its logic state from "1" to "0" at time $t_2'$ (FIG. 7l). NAND gate 70 returns to logic "1" level when NOR gate 57 changes to logic "1" in response to logic "0"s from the true outputs of flip-flops 58, 59 when NOR gate 57 changes to logic "1" at time $t_3$. During the time inverval between $t_2$ to $t_2'$ AND gate 71 is enabled to pass inverted clock pulses to the clock input of flip-flop 60 of the second counter 102 (FIG. 7m).

On the other hand, the flip-flop 62, which serves as a third stage of the third counter 103, receives input pulses from the Q output of flip-flop 48 through AND gate 76 when the latter is enabled during the time interval between $t_1$ and $t_2$ (FIG. 7k). It is understood from the foregoing that every four clock pulses corresponds to a single pulse delivered from the Q output of flip-flop 48 of the first counter 101, so that the second counter 102 counts twelve clock pulses during the time interval $t_1$ to $t_2$. During the next interval $t_2$ to $t_3$ the second counter 102 receives three clock pulses instead of four because at time $t_2'$ the NAND gate 70 is activated to produce a one-bit elimination pulse after the third counter 103 has counted three clock pulses. Therefore, during the interval $t_1$ to $t_3$, the second counter 102 counts 15 clock pulses instead of 16, and the binary states of the output terminals K, J, I, H, G and F, are consequently "0 0 1 1 1 1", respectively.

Assuming that if the control binary states are "1 0 1 0", similar events occur during the time interval $t_1$ to $t_3$ as shown in FIGS. 8a to 8m. During the time prior to time $t_4$ 24 clock pulses are received by the first counter 101 so that the binary states of its flip-flops 52, 51, 50 and 49 are respectively "0 1 1 0" which in turn satisfy the input conditions of AND gate 54 causing it to provide a logic "1" to NOR gate 57 to alter its output state to logic "0" at time $t_4$ (FIG. 8j). Thus, the third counter 103 is enabled to count clock pulses and at the third clock pulse NAND gate 70 is switched to logic "0" level and remains there until time $t_5$, thereby eliminating a further clock pulse to be supplied to second counter during the interval $t_4$ to $t_5$. During the next interval $t_5$ to $t_6$ the first counter 101 is incremented by four clock pulses so that its flip-flops 52, 51, 50 and 49 are respectively "1 0 0 0" which satisfy the input conditions of AND gate 55 to cause NOR gate 57 to provide logic "0" at time $t_6$ enabling third counter 103 to count further three input clock pulses whereupon NAND gate 70 produces an inhibit pulse to eliminate the fourth clock pulse that occurs during the time interval $t_6$ to $t_7$. The differentiator circuit formed by AND gate 66 and inverter 67 delivers a pulse 57x to the reset inputs of flip-flops 58, 59 of their counter 103 to cause the NAND gate 70 to return to the logic "1" level (FIG. 8j). During the interval $t_6$ to $t_7$ the binary states of the first counter 101 changes to "1 0 0 1" which meets the input conditions of NAND gate 56 to further exclude a clock pulse from the four-clock pulse train which occurs during the next interval $t_7$ to $t_8$.

It will be understood therefore that each of the AND gates 53 to 56 serves as a one-bit-elimination command circuit responsive to a set of predetermined input binary conditions. In the case of the control inputs "1 0 1 0", four clock pulses are eliminated during the interval $t_1$ to $t_8$ while the first counter 101 receives 40 clock pulses, so that the second counter 102 receives, during this interval, 36 clock pulses which correspond to output binary states of "1 0 0 1 0 0". In other words, the AND gate 76 serves to increment the second counter 102 by four binary digits in response to every four clock pulses and subtracts four clock pulses in response to each one-bit-elimination command signal from NOR gate 57, and AND gate 71 serves to add three clock pulses to the first stage of second counter 102 incrementing it by three binary digits (FIGS. 8k and 8m).

In the foregoing description, the number of binary states available for the control input terminals A-D is 10. However this number can be increased by providing additional AND gates between the output terminals of flip-flops 49-52 of the first counter 101 and input terminals of NOR gate 57. This is an advantageous feature of the embodiment of FIG. 5 over the FIG. 2 embodiment, because in the latter the number of control binary states can only be increased with a greater number of logic gates than is required in the FIG. 5 embodiment.

What is claimed is:

1. A programmable digital frequency divider comprising:
    a programmable binary counter respective of input pulses from a pulse source and having a plurality of control terminals for generating output pulses at a frequency variable in accordance with a set of binary states of said control terminals; and
    a binary code converter comprising a plurality of input terminals to which is applied an M-bit input binary signal, a plurality of output terminals connected to said control terminals of said programmable counter, and a logic circuit connected between said input and output terminals for converting said M-bit input binary signal into an N-bit output binary signal for application to said output terminals, where N equals an integral multiple of M minus an error compensating number which causes the frequency of said output pulses to vary substantially linearly as a function of discrete variations of said input binary signal.

2. A programmable digital frequency divider comprising:
    a programmable binary counter receptive of input pulses from a pulse source and having a plurality of control terminals for generating output pulses at a frequency variable in accordance with a set of binary states of said control terminals;
    a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
    wherein the modified binary number is an integral multiple of the corresponding normal binary number minus error compensating binary digits, the number of said compensating binary digits varying in dependence on the particular binary number; and further
    wherein said logic circuit of said binary code converter comprises a plurality of inverters connected to said input terminals, a plurality of AND gates connected to the outputs of said inverters and said input terminals, and a plurality of OR gates connected to receive output signals from said AND gates, the output terminals of said OR gates being connected respectively to said output terminals of said binary code converter.

3. A programmable digital frequency divider comprising:
    a programmable binary counter receptive of input pulses from a pulse source and having a plurality of control terminals for generating output pulses at a frequency variable in accordance with a set of binary states of said control terminals; and
    a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
    and
    wherein said logic circuit comprises first means for counting said input pulses to increment the binary states of said output terminals, means for eliminating said input pulse at predetermined intervals, and second means for counting said input pulses to disable said first counting means in response to a count determined by said binary states of said control terminals.

4. A programmable digital frequency divider comprising:
    a programmable binary counter receptive of input pulses from a pulse source and having a plurality of control terminals for generating output pulses at a frequency variable in accordance with a set of binary states of said control terminals;
    a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals; and wherein said logic circuit comprises a counter having a plurality of counter states connected respectively to said output terminals of said binary code converter, means connected to said input terminals of said binary code converter for enabling said counter to count said input pulses for a period of time depending on the binary states of said input terminals, and means for eliminating an input pulse to be counted by said counter at predetermined intervals.

5. A programmable digital frequency divider comprising:

a programmable binary counter receptive of input pulses from a pulse source and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;

and wherein said logic circuit of said binary code converter comprises a first binary counter having a plurality of counter stages for receiving said input pulses, a plurality of coincidence gates connected to the counter stages of said first binary counter for generating a coincidence output in response to each of a plurality of sets of predetermined binary states of the counter stages of said first binary counter, a second binary counter having a plurality of counter stages connected respectively to said output terminals, means connected to said input terminals and to said counter stages of said first binary counter for enabling said second binary counter to receive said input pulses, and means responsive to said coincidence output for eliminating an input pulse to be received by said second binary counter.

6. A programmable digital frequency divider comprising:

a programmable binary counter receptive of input pulses from a pulse source and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals; and wherein said logic circuit of said binary code converter comprises:

a first binary counter having a first group of counter stages for generating an output pulse in response to a count of "m" input pulses and a second group of counter stages responsive to the output pulse of said first group counter stages;

means for detecting noncoincidence between the binary states of the input terminals of said binary code converter and the binary states of the second group counter stages of said first binary counter to enable said first group counter stages of said first binary counter to receive said input pulses and detecting coincidence therebetween to disable said first group counter stages of said first counter;

a second binary counter having a first group of counter stages for generating an output pulse in response to a count of "m" input pulses and a second group of counter stages responsive to the output pulses of said first group counter stages of said first and second binary counters, the output terminals of all of said counter stages of said second counter being connected respectively to the output terminals of said binary code converter;

a third binary counter for generating an output pulse in response to a count of "m−1" input pulses for eliminating an input pulse to be received by said first group counter stages of said second binary counter; and means including a plurality of coincidence gates connected respectively to the second group counter stages of said first binary counter to establish a plurality of sets of binary conditions to develop an output pulse in each of said coincidence gates in response to said second group counter stages of said first binary counter satisfying said established set of binary conditions for enabling said third binary counter and said first group counter stages of said second binary counter to receive said input pulses and disabling said second group counter stages of said second binary counter.

7. A digital frequency synthesizer comprising:

a source of clock pulses;

a programmable binary counter receptive of said clock pulses and having a plurality of control terminals for generating output pulses at a frequency variable in accordance with a set of binary states of said control terminals; and a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals.

8. A digital frequency synthesizer as claimed in claim 7, wherein the modified binary number is an integral multiple of the corresponding input binary number minus error compensating binary digits, the number of said compensating binary digits varying in dependence on the particular binary number.

9. A digital frequency synthesizer comprising:
a source of clock pulses;
a programmable binary counter receptive of said clock pulses and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;
and
wherein said logic circuit of said binary code converter comprises a plurality of inverters connected to said input terminals, a plurality of AND gates connected to the outputs of said inverters and said input terminals, and a plurality of OR gates connected to receive output signals from said AND gates, the output terminals of said OR gates being connected respectively to said output terminals of said binary code converter.

10. A digital frequency synthesizer comprising:
a source of clock pulses;
a programmable binary counter receptive of said clock pulses and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;
and
wherein said logic circuit comprises first means for counting said clock pulses to increment the binary states of said outputs terminals, means for eliminating a said input pulse at predetermined intervals, and second means for counting said clock pulses to disable said first counting means in response to a count determined by said binary states of said control terminals.

11. A digital frequency synthesizer comprising:
a source of clock pulses;
a programmable binary counter receptive of said clock pulses and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals; and
wherein said logic circuit comprises a counter having a plurality of counter stages connected respectively to said output terminals of said binary code converter, means connected to said input terminals of said binary code converter for enabling said counter to count said clock pulses for a period of time depending on the binary states of said input terminals, and means for eliminating a clock pulse to be counter by said counter at predetermined intervals.

12. A digital frequency synthesizer comprising:
a source of clock pulses;
a programmable binary counter receptive of said clock pulses and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals; and
wherein said logic circuit of said binary code converter comprises a first binary counter having a plurality of counter stages for receiving said clock pulses, a plurality of coincidence gates connected to the counter stages of said first binary counter for generating a coincidence output in response to each of a plurality of sets of predetermined binary states of the counter stages of said first binary counter, a second binary counter having a plurality of counter stages connected respectively to said output terminals, means connected to said input terminals and to said counter stages of said first binary counter for enabling said second binary counter to receive said clock pulses, and means responsive to said coincidence output for eliminating a clock pulse to be received by said second binary counter.

13. A digital frequency synthesizer comprising:
a source of clock pulses;
a programmable binary counter receptive of said clock pulses and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals; and
wherein said logic cicuit of said binary code converter comprises:
- a first binary counter having a first group of counter stages for generating an output pulse in response to a count of "m" clock pulses and a second group of counter stages responsive to the output pulse of said first group counter stages;
- means for detecting noncoincidence between the binary states of the input terminals of said binary code converter and the binary states of the second group counter stages of said first binary counter to enable said first group counter stages of said first binary counter to receive said clock pulses and detecting coincidence therebetween to disable said first group counter stages of said first counter;
- a second binary counter having a first group of counter stages for generating an output pulse in response to a count of "m" clock pulses and a second group of counter stages responsive to the output pulses of said first group counter stages of said first and second binary counters, the output terminals of all of said counter stages of said second counter being connected respectively to the output terminals of said binary code converter;
- a third binary counter for generating an output pulse in response to a count of "m−1" clock pulses for eliminating a clock pulse to be received by said first group counter stages of said second binary counter; and
- means including a plurality of coincidence gates connected respectively to the second group counter stages of said first binary counter to establish a plurality of sets of binary conditions to develop an output pulse in each of said coincidence gates in response to said second group counter stages of said first binary counter satisfying said established set of binary conditions for enabling said third binary counter and said first group counter stages of said second binary counter to receive said clock pulses and disabling said second group counter stages of said second binary counter.

14. A programmable digital frequency divider comprising:
a programmable binary counter receptive of input pulses from a pulse source and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
wherein the modified binary number is an integral multiple of the corresponding normal binary number minus error compensating binary digits, the number of said compensating binary digits varying in dependence on the particular binary number; and further
wherein said logic circuit comprises first means for counting said input pulses to increment the binary states of said output terminals, means for eliminating said input pulse at predetermined intervals, and second means for counting said input pulses to disable said first counting means in response to a count determined by said binary states of said control terminals.

15. A programmable digital frequency divider comprising:
a programmable binary counter receptive of input pulses from a pulse source and having a plurality of control terminals for generating output pulses at a frequency variable in accordance with a set of binary states of said control terminals;
a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
wherein the modified binary number is an integral multiple of the corresponding normal binary number minus error compensating binary digits, the number of said compensating binary digits varying in dependence on the particular binary number; and further
wherein said logic circuit comprises a counter having a plurality of counter stages connected respectively to said output terminals of said binary code converter, means connected to said input terminals of said binary code converter for enabling said counter to count said input pulses for a period of time depending on the binary states of said input terminals, and means for eliminating an input pulse to be counted by said counter at predetermined intervals.

16. A programmable digital frequency divider comprising:
- a programmable binary counter receptive of input pulses from a pulse source and having a plurality of control terminals for generating output pulses at a frequency variable in accordance with a set of binary states of said control terminals;
- a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
- wherein the modified binary number is an integral multiple of the corresponding normal binary number minus error compensating binary digits, the number of said compensating binary digits varying in dependence on the particular binary number; and further
- wherein said logic circuit of said binary code converter comprises a first binary counter having a plurality of counter stages for receiving said input pulses, a plurality of coincidence gates connected to the counter stages of said first binary counter for generating a coincidence output in response to each of a plurality of sets of predetermined binary states of the counter stages of said first binary counter, a second binary counter having a plurality of counter stages connected respectively to said output terminals, means connected to said input terminals and to said counter stages of said first binary counter for enabling said second binary counter to receive said input pulses, and means responsive to said coincidence output for eliminating an input pulse to be received by said second binary counter.

17. A programmable digital frequency divider comprising:
- a programmable binary counter receptive of input pulses from a pulse source and having a plurality of control terminals for generating output pulses at a frequency variable in accordance with a set of binary states of said control terminals;
- a binary code converter comprising a plurality of input terminals and a plurality of output terminals connected to said control terminals of said programmable counter, and a logic circuit for converting a set of binary states of said input terminals supplied in the form of normal binary number system into a set of binary states of said output terminals in the form of a modified binary number system for conditioning said programmable counter such that the frequency of said output pulses is substantially linearly variable as a function of discrete variations of the binary states of said input terminals;
- wherein the modified binary number is an integral multiple of the corresponding normal binary number minus error compensating binary digits, the number of said compensating binary digits varying in dependence on the particular binary number; and further
- wherein said logic circuit of said binary code converter comprises:
  - a first binary counter having a first group of counter stages for generating an output pulse in response to a count of "m" input pulses and a second group of counter stages responsive to the output pulse of said first group counter stages;
  - means for detecting noncoincidence between the binary states of the input terminals of said binary code converter and the binary states of the second group counter stages of said first binary counter to enable said first group counter stages of said fist binary counter to receive said input pulses and detecting coincidence therebetween to disable said first group counter stages of said first counter;
  - a second binary counter having a first group of counter stages for generating an output pulse in response to a count of "m" input pulses and a second group of counter stages responsive to the output pulses of said first group counter stages of said first and second binary counters, the output terminals of all of said counter stages of said second counter being connected respectively to the output terminals of said binary code converter;
  - a third binary counter for generating an output pulse in response to a count of "m−1" input pulses for eliminating an input pulse to be received by said first group counter stages of said second binary counter; and
  - means including a plurality of coincidence gates connected respectively to the second group counter stages of said first binary counter to establish a plurality of sets of binary conditions to develop an output pulse in each of said coincidence gates in response to said second group counter stages of said first binary counter satisfying said established set of binary conditions for enabling said third binary counter and said first group counter stages of said second binary counter to receive said input pulses and disabling said second group counter stages of said second binary counter.

18. A digital frequency synthesizer comprising:
- a source of clock pulses;
- a programmable binary counter receptive of said clock pulses and having a plurality of control terminals for generating output pulses at a frequency variable in accordance with a set of binary states of said control terminals;
- a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;
- wherein the modified binary number is an integral multiple of the corresponding input binary number minus error compensating binary digits, the number of said compensating binary digits varying in dependence on the particular binary number; and further wherein said logic circuit of said binary code converter comprises a plurality of inverters connected to said input terminals, a plurality of AND gates connected to the outputs of said inverters and said input terminals, and a plurality of OR gates connected to receive output signals from said AND gates, the output terminals of said OR gates being connected respectively to said output terminals of said binary code converter.

19. A digital frequency synthesizer comprising:

a source of clock pulses;

a programmable binary counter receptive of said clock pulses and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;

wherein the modified binary number is an integral mulitple of the corresponding input binary number minus error compensating binary digits, the number of said compensating binary digits varying in dependence on the particular binary number; and further wherein said logic circuit comprises first means for counting said clock pulses to increment the binary states of said outputs terminals, means for eliminating a said input pulse at predetermined intervals, and second means for counting said clock pulses to disable said first counting means in response to a count determined by said binary states of said control terminals.

20. A digital frequency synthesizer comprising:

a source of clock pulses;

a programmable binary counter receptive of said clock pulses and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;

wherein the modified binary number is an integral multiple of the corresponding input binary number minus error compensating binary digits, the number of said compensating binary digits varying in dependence on the particular binary number; and further wherein said logic circuit comprises a counter having a plurality of counter stages connected respectively to said output terminals of said binary code converter, means connected to said input terminals of said binary code converter for enabling said counter to count said clock pulses for a period of time depending on the binary states of said input terminals, and means for eliminating a clock pulse to be counter by said counter at predetermined intervals.

21. A digital frequency synthesizer comprising:

a source of clock pulses;

a programmable binary counter receptive of said clock pulses and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;

wherein the modified binary number is an integral multiple of the corresponding input binary number minus error compensating binary digits, the number of said compensating binary digits varying in dependence on the particular binary number; and further wherein said logic circuit of said binary code converter comprises a first binary counter having a plurality of counter stages for receiving said clock pulses, a plurality of coincidence gates connected to the counter stages of said first binary counter for generating a coincidence output in response to each of a plurality of sets of predetermined binary states of the counter stages of said first binary counter, a second binary counter having a plurality of counter stages connected respectively to said output terminals, means connected to said input terminals and to said counter stages of said first binary counter for enabling said second binary counter to receive said clock pulses, and means responsive to said coincidence output for eliminating a clock pulse to be received by said second binary counter.

22. A digital frequency synthesizer comprising:

a source of clock pulses;

a programmable binary counter receptive of said clock pulses and having a plurality of control terminals for generating output pulses at a frequency variable in accordance with a set of binary states of said control terminals;

a binary code converter comprising a plurality of input terminals and a plurality of output terminals connected to said control terminals of said programmable counter, and a logic circuit for converting a set of binary states of said input terminals supplied in the form of a normal binary number system into a set of binary states of said output terminals in the form of a modified binary number system for conditioning said programmable counter such that the frequency of said output pulses is substantially linearly variable as a function of discrete variations of the binary states of said input terminals;

wherein the modified binary number is an integral multiple of the corresponding input binary number minus error compensating binary digits, the number of said compensating binary digits varying in dependence on the particular binary number; and further wherein said logic circuit of said binary code converter comprises:
- a first binary counter having a first group of counter stages for generating an output pulse in response to a count of "m" clock pulses and a second group of counter stages responsive to the output pulse of said first group counter stages;
- means for detecting noncoincidence between the binary states of the input terminals of said binary code converter and the binary states of the second group counter stages of said first binary counter to enable said first group counter stages of said first binary counter to receive said clock pulses and detecting coincidence therebetween to disable said first group counter stages of said first counter;
- a second binary counter having a first group of counter stages for generating an output pulse in response to a count of "m" clock pulses and a second group of counter stages responsive to the output pulses of said first group counter stages of said first and second binary counters, the output terminals of all of said counter stages of said second counter being connected respectively to the output terminals of said binary code converter;
- a third binary counter for generating an output pulse in response to a count of "m−1" clock pulses for eliminating a clock pulse to be received by said first group counter stages of said second binary counter; and
- means including a plurality of coincidence gates connected respectively to the second group counter stages of said first binary counter to establish a plurality of sets of binary conditions to develop an output pulse in each of said coincidence gates in response to said second group counter stages of said first binary counter satisfying said established set of binary conditions for enabling said third binary counter and said first group counter stages of said second binary counter to receive said clock pulses and disabling said second group counter stages of said second binary counter.

* * * * *